US008461838B2

(12) United States Patent
Brinker et al.

(10) Patent No.: US 8,461,838 B2
(45) Date of Patent: Jun. 11, 2013

(54) METHOD AND DEVICE FOR SELECTING BODY MODEL POSITIONS FOR SAR MONITORING OF A MAGNETIC RESONANCE TRANSMIT ARRAY

(75) Inventors: Gerhard Brinker, Erlangen (DE); Dirk Diehl, Erlangen (DE); Matthias Gebhardt, Erlangen (DE); Juergen Nistler, Erlangen (DE); Volker Schnetter, Hoechstadt a.d. Aisch (DE)

(73) Assignee: Siemens Aktiengesellschaft, Munich (DE)

( * ) Notice: Subject to any disclaimer, the term of this patent is extended or adjusted under 35 U.S.C. 154(b) by 567 days.

(21) Appl. No.: 12/793,866

(22) Filed: Jun. 4, 2010

(65) Prior Publication Data

US 2010/0308825 A1 Dec. 9, 2010

(30) Foreign Application Priority Data

Jun. 5, 2009 (DE) .......................... 10 2009 024 077

(51) Int. Cl.
*G01V 3/00* (2006.01)
(52) U.S. Cl.
USPC .......................................... 324/307; 324/309
(58) Field of Classification Search
USPC ......................... 324/300–322; 600/407–445
See application file for complete search history.

(56) References Cited

U.S. PATENT DOCUMENTS

| 7,800,368 B2* | 9/2010 | Vaughan et al. | 324/318 |
| 8,120,359 B2* | 2/2012 | Diehl et al. | 324/309 |
| 2007/0108976 A1 | 5/2007 | Morich et al. | |
| 2010/0164494 A1 | 7/2010 | Koretsky | |
| 2012/0032678 A1* | 2/2012 | Vaughan et al. | 324/318 |
| 2012/0086449 A1* | 4/2012 | Graesslin et al. | 324/309 |
| 2012/0223709 A1* | 9/2012 | Schillak et al. | 324/309 |
| 2012/0256626 A1* | 10/2012 | Adalsteinsson et al. | 324/309 |

OTHER PUBLICATIONS

"A Conservative Method for Ensuring Safety within Transmit Arrays," Collins et al., Proc. Intl. Soc. Mag. Reson. Med., 15 (2007) p. 1092.
"Calculation of SAR for Transmit Coil Arrays," Mao et al, Concepts in Magnetic Resonance, Part B (Magnetic Resonance Engineering), vol. 31 B(2) (2007), pp. 127-131.
"Patient Safety Concept for Multichannel Transmit Coils," Seifert et al., Journal of Magnetic Resonance Imaging, vol. 26 (2007) pp. 1315-1321.

(Continued)

*Primary Examiner* — Brij Shrivastav
(74) *Attorney, Agent, or Firm* — Schiff Hardin LLP

(57) ABSTRACT

In a method and a device for specific absorption rate monitoring in a magnetic resonance system wherein multiple transmit coils are independently charged with respective currents, a primary model point voxel and at least one auxiliary model point voxel are automatically selected from among multiple voxels that model a modeled examination subject. The primary model point voxel is that voxel in which an absolute maximum of a total field variable occurs that is produced by the respective electrical fields emitted by the transmit coils. The at least one auxiliary model point voxel is that voxel in which a relative maximum of the variable occurs. The primary model point voxel and the at least one auxiliary model point voxel are stored, and specific absorption rate monitoring of an actual examination subject in the magnetic resonance system is implemented during the acquisition of magnetic resonance data in respective voxels of the actual examination subject corresponding to the stored primary model point voxel and the stored at least one auxiliary model point voxel.

32 Claims, 12 Drawing Sheets

OTHER PUBLICATIONS

SAR Assessment of Transmit Arrays: Deterministic Calculation of Worst- and Best-case Performance, Brunner et al., $17^h$ Annual ISMRM Scientific Meeting and Exhibition (2009), vol. 9, p. 5383.
"Simultaneous $B^+_1$ Homogenization and Specific Absorption Rate Hotspot Suprresion Using a Magnetic Resonance Phased Array Transmit Coil," Cornelis et al., Magnetic Resonance in Medicine, vol. 57 (2007) pp. 577-586.

* cited by examiner

Part 1 - Step 1:

Part 2 - Step 2:

Pretests with hypothetical data $E_k(x) = I_k * 200.0 \, (x-r_k)/|x-r_k|^2 * \exp(2\pi i \, |x-r_k| / 600.0)$ on a 10 x 10 x 10 3D Grid with $k = 1,..., 8$ TX antennas with antenna currents $I_k$ Vector diagram for $\text{Re}(E_1(x))$ mit $I_1 = 1.0$ Test:
Decrease of $E^2$-weighted ("Sine-Square") against the number of concurrently considered phase vectors (or model points linked with these) in hypothetical data

FIG 12

Test: Which virtual measurement points detects how many hotspot maxima

| Virtual measurement point # | 1 | 4 | 6 | 44 | 38 | 26 | 32 |
|---|---|---|---|---|---|---|---|
| Number of matches | 8497 | 1161 | 306 | 12 | 10 | 8 | 6 |

METHOD AND DEVICE FOR SELECTING BODY MODEL POSITIONS FOR SAR MONITORING OF A MAGNETIC RESONANCE TRANSMIT ARRAY

BACKGROUND OF THE INVENTION

1. Field of the Invention

The present invention concerns methods and devices for monitoring an examination subject in a magnetic resonance apparatus.

2. Description of the Prior Art

Identification of the local SAR in an MR scanner has not previously been possible by means of measurement in clinical practice. The only known and used technique is to make use of a theoretical simulation (model) that accounts for both the patient and the structure of the transmission antenna as an electrical model. In the operation of MR scanners with a transmission array and with RF pulses that can exhibit an arbitrary pulse shape for each array element (variation of amplitude and phase), a multitude of overlay possibilities result. Comprehensive monitoring in the local SAR thus would involve a high degree of complexity, but monitoring of the local SAR value is absolutely necessary for the safety of the patient and is required by corresponding regulations. The overlaying of the electrical fields in array antennas is in particular critical because the E-vectors add linearly but the local power transfer is proportional to $E^2$.

In a system with K elements, L phase steps and M amplitudes, $(M*L)^K$ combination possibilities result for every model point in the search for a maximum potential hotspot.

Given a typical exposed mass of 50 kg and a hotspot size of one gram, 50,000 model points result for which these combination possibilities must be considered. Given a higher channel count and appropriate resolution (phase and amplitude), the determination of all combinations for every model point is not applicable for clinical application. One possibility loophole is focusing on a reduced number of suitably selected model points that cover the possible amplitude and phase combinations as well as possible.

However, the monitoring for individually selected potential "hotspots" is generally not simple. For example, if a model point at which the E-fields of the individual antennas can theoretically superimpose at maximum (for example given antenna currents that are the same in terms of magnitude) is determined from among all model points in the patient model, this maximum is the case at this model point only for a specific distribution of the phases of these currents.

If the heat production determined by calculation at this model point is now monitored as being representative of all voxels, the actual maximum superimposition of the electrical fields can occur at other model points (that are not monitored) if the phase distribution of the currents deviates from the specific distribution (for example polarity reversal of a single antenna current). The SAR monitoring thus would be virtually blind to the actual occurring maximum.

SUMMARY OF THE INVENTION

An object of the present invention is to provide a method to systematically select model points that are best suited for an optimally comprehensive monitoring of the local SAR of the entire patient.

A systematic approach with regard to all possible field superpositions is not known. Conventional approaches normally use calculation methods for predetermined current distributions at the array elements, for example with the CP mode. Numerous basic tasks exist for electromagnetic calculation of the electrical fields and SAR values in patient models. This calculation of the fields of individual array elements with such methods is the basis for the combinatorial analysis of the fields that is the subject matter of this invention.

It is the intent of the present invention to improve the SAR monitoring of an examination subject in a magnetic resonance tomography apparatus.

The method is implemented in a computerized processor.

The above object is achieved in accordance with the present invention by a method for specific absorption rate (SAR) monitoring in a magnetic resonance (MR) system having multiple transmission coils, that are individually activated by being charged with respective currents that cause each coil to emit an electrical field, having a field variable pertaining thereto, with each current having a magnitude and a phase. In accordance with the present invention, a modeled examination subject is modeled in a computerized processor as a number of voxels, each respective voxel having a total electrical field therein that is produced by vector addition of respective contributions to the respective voxel by the respective electrical fields emitted by the respective transmit coils. This total electric field exhibits a total field variable. In the computerized processor, a primary model point voxel is automatically identified, from among the multiple voxels of the modeled examination subject, in which an absolute maximum of the total field variable exists within the modeled examination subject. Additionally in the computerized processor, at least one auxiliary model point voxel is identified, from among the multiple voxels of the modeled examination subject, in which a relative maximum of the total field variable exists within the modeled examination subject.

Further in accordance with the invention, in the computerized processor, a back-calculation is automatically executed that, from the total field variable for the primary model point voxel, calculates respective relative times of activation of the respective coils in the multiple transmit coils in order to produce the total field variable at the primary model point voxel. The same type of back-calculation is also undertaken for the at least one auxiliary model point voxel to determine respective relative times of activation of the respective coils in the multiple transmission coils to produce via total field variable at the auxiliary model point voxel.

The primary model point voxel and the least one auxiliary model point voxel are stored. When MR data are subsequently acquired from an actual examination subject in the MR system, the stored primary model point voxel and the stored auxiliary model point voxel are retrieved and the SAR of the actual examination subject is monitored at voxels in the actual examination subject respectively corresponding to the primary model point voxel and the auxiliary model point voxel.

The first through penultimate step of the method are advantageously implemented for multiple different possible examination subjects before a present examination subject is examined in the magnetic resonance apparatus, wherein—if a present examination subject is examined in the magnetic resonance apparatus—it is determined which of the most similar of the possible examination subjects corresponds best to the present examination subject (the examination subject to be examined), in particular with regard to weight and shape; whereupon a respective variable pertaining to the electrical field is determined for the most similar of the examination subjects for specific voxels in the present examination subject (the examination subject to be examined) and is used for the SAR monitoring. This enables a fast and efficient monitoring of patients of different statures.

The invention also encompasses a computerized device that implements the above method with a processor configured (programmed) to implement the aforementioned method steps.

BRIEF DESCRIPTION OF THE DRAWINGS

FIG. 12 shows, as a test, which virtual measurement point detects, and how many hotspot maxima.

DESCRIPTION OF THE PREFERRED EMBODIMENTS

Figure 1:
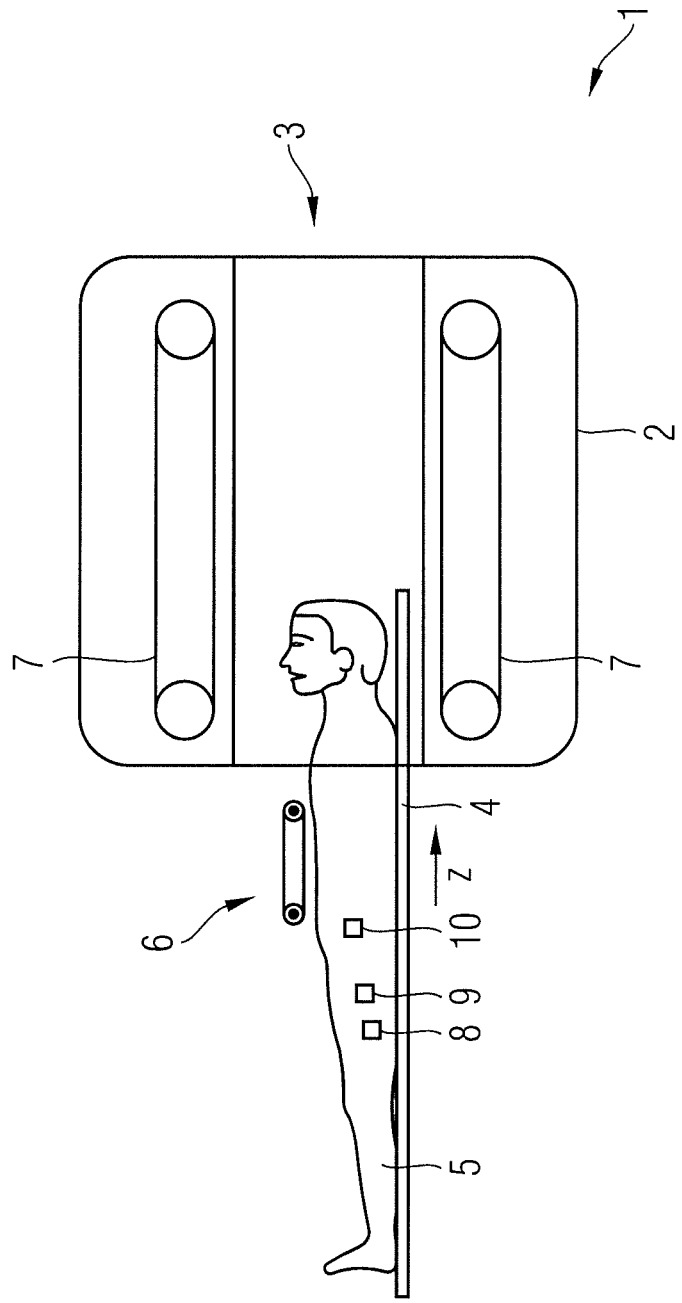
FIG. 1 schematically illustrates, a whole-body MRT coil and a local coil.

FIG. 1 shows a magnetic resonance apparatus 1 with a whole-body coil 2 and a tube-shaped space 3 into which a patient bed 4 with, for example, a patient 5 and a local coil 6 can be driven in order to generate exposures of the patient 5. Here a local coil with which good exposures are enabled in a local region is placed on the patient. The maximum SAR in the patient 5 should be monitored; for this multiple points 8, 9, 10 (also called model points 8, 9, 10 in the following) in the patient 5 should be determined at which absolute or relative maximum power density is realized (thus a greater power density than at other points in the patient). The point at which the highest power density occurs is called the primary model point voxel 8 in the following; points at which lower power density occurs than at the primary model point voxel 8 (but more than is expected elsewhere in the patient) are called auxiliary model point voxels 9, 10 (voxels are small volumes, for example small cuboids in the patient or examination subject).

Figure 2:
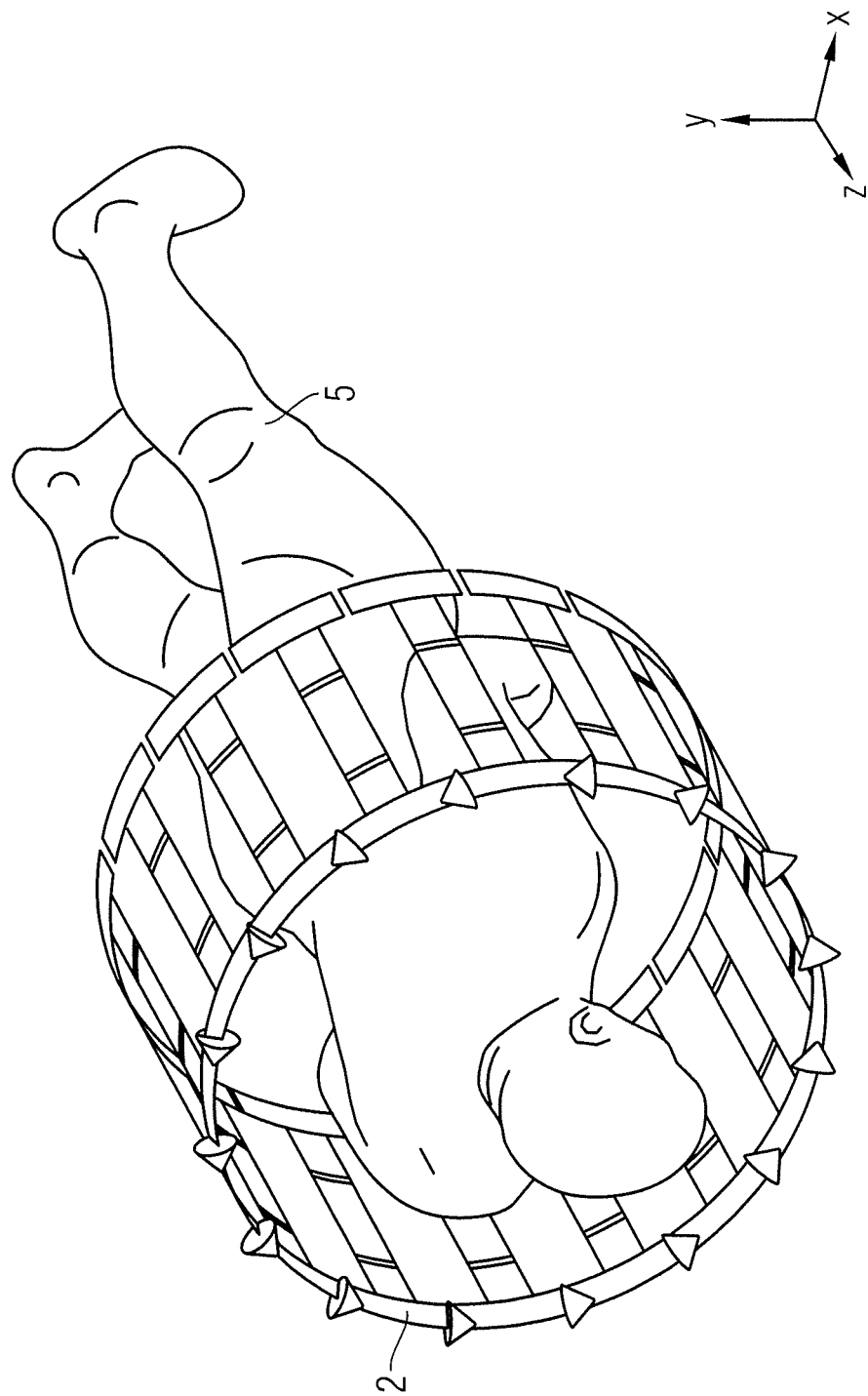
FIG. 2 shows an eight-channel system of a whole-body MRT coil, wherein every two antenna rods are combined into one transmission coil.

As an example, FIG. 2 shows the patient 5 in an eight-channel MRT system 2, wherein every two antenna rods are respectively combined (including a 22.5° relative phase rotation). Electrical fields are simulated with an exemplary model of a TX array, together with a HUGO patient model, 4 mm resolution, FDTD with Microwave Studio, wherein a central disc in the direction of the body axis lies in the resonator center, with 27 incorporated slices.

Methods and devices are described herein that enable the SAR calculation to be implemented for arbitrarily combined RF pulse shapes at relatively few monitoring points (as noted above, the location of the first monitoring point is also called a primary model point voxel and the locations of the additional monitoring points are also called auxiliary model point voxels), and therefore the entire (modeled) body is covered as well as possible with regard to the relevant local heating (known as "hotspots"). In particular, the method in accordance with the invention is directed to finding these model points (primary model point voxel and auxiliary model point voxels) after the calculations of the individual fields of the array elements that cover the entire exposed volume have been implemented once with a sufficiently large number of model points for a reference condition. In addition to the reduction of the computing effort for monitoring the local SAR, this method allows the compression of the very considerable model data for the evaluation of sensitivity considerations with regard to model changes. Beyond this, through the compression it is also possible to implement "worst case" overlays from different patient models, and thus to expand the scope of validity of an employed basis for local SAR calculation. The idea of the model point search method can also be considered for overlaying multiple patient models.

The invention utilizes the fact that the electrical field that every array element produces at every model point depends linearly on the excitation current of this array element, and the fact that the individual fields of multiple array elements combine linearly.

The (electrical) field at the model point i that is caused by the array elements indexed with j is thus represented as the following sum:

$$E_i = \Sigma S_{ij} I_j.$$

All involved variables are generally complex in nature, the values of E three-dimensional complex vectors.

However, in principle this method can also be expanded for a representation with a conductivity sensor.

The values of the sensitivity matrix must have been determined by a preceding calculation with an electromagnetic model (for example the FDTD method).

The locally produced RF power density (for example in a voxel) is then the product Re $(E^*\text{conj}(E)^*\sigma)$, wherein cy is the locally complex conductivity of the body. Here the additional considerations for a modified "effective" field E' and the sensitivity matrix S' that is connected with this (in which a has already been included, thus Re $(E'^*\text{conj}(E')):=\text{Re }(E^*\text{conj}(E)^*\sigma)$ and $E_i':=: \Sigma S_{ij}' I_j$) are appropriately implemented.

At the point of a scalar value σ, in general a diagonal tensor can also occur with different conductivities in the three primary axis directions ($\sigma_x$, $\sigma_y$, $\sigma_z$). In this case the powers that result due to the electrical field components $E_x$, $E_y$, $E_z$ are calculated and added separately per model point. All additional considerations remain valid without limitation.

The invention in particular concentrates on the scenario in which the fields of the TX array elements maximally superimpose, i.e. exhibit relatively high current strengths. The cases in which a single array element dominates do not need to be additionally considered.

The model point (primary model point in the primary model voxel) is initially determined at which the fields of antenna currents that are identical in terms of magnitude can theoretically maximally overlap, as are the phases of the antenna currents that produce this maximum overlap.

The phase distribution of the currents at which the largest SAR value locally results is also determined for each model point.

Due to the linearity of the above equations for the entire volume, SAR values that are now calculated for this model point (primary model point) cover the local SAR value calculation, but only for current distributions that correspond except for a complex factor of the found current distribution.

Current distributions that are linearly independent relative to the found current distributions (i.e. have other amplitudes or phase ratios) are not monitored in the monitoring of SAR at this hotspot, but can likewise cause relevant local heating at other model points.

One method to find an additional model point (thus an auxiliary model point voxel) at which a maximally high SAR can occur (as a relative maximum) to which the monitoring of the first model point is blind can be achieved by the following steps:

Of the local maximum current distributions that are found in the first search, those that produce a minimal local heating at the first model point (primary model point) are additionally considered. These are now evaluated with regard to their heating at other model points.

This method can be applied iteratively until the resultant heating changes only slightly due to the remaining possible current distributions.

This result is now theoretically still limited to the framework condition that all antenna elements are operated with the same current magnitude. If the antenna currents have different amplitudes in the actual excitation, this can be approximated by a corresponding adjustment of the relative phases in the overlaying. However, the model points are selected so as to be optimally sensitive to this.

Separate consideration of the case that only individual antenna elements with different currents are actually operated can be done due to the absent overlaying effect, which cannot be utilized here. For example, this can ensue in that the potential hotspots of the individual excitations are to be added to those for the combinations.

How the E-vectors of different TX contributions can be superimposed is apparent from FIG. 3-6.

Figure 3:
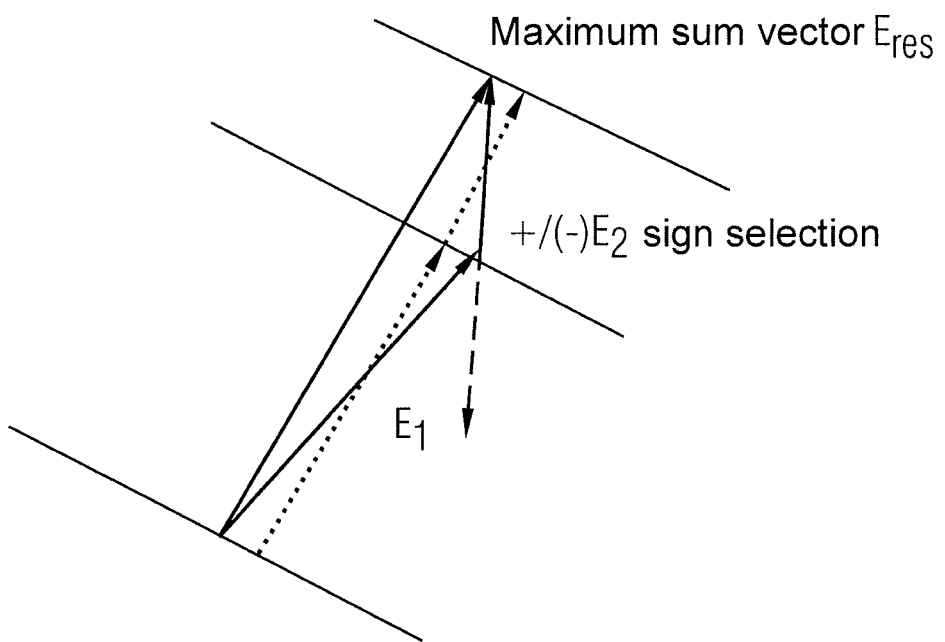
FIG. 3 illustrates the overlaying of both E-vectors of two antennas.

FIG. 3 shows (Part 1-Step 1) for two antennas the spatial worst case of an overlaying of two E-vectors $E_1$ and $E_2$ that are both produced at a model point via one antenna current per antenna.

A real case—meaning + and − signs are allowed—is considered.

Figure 4:
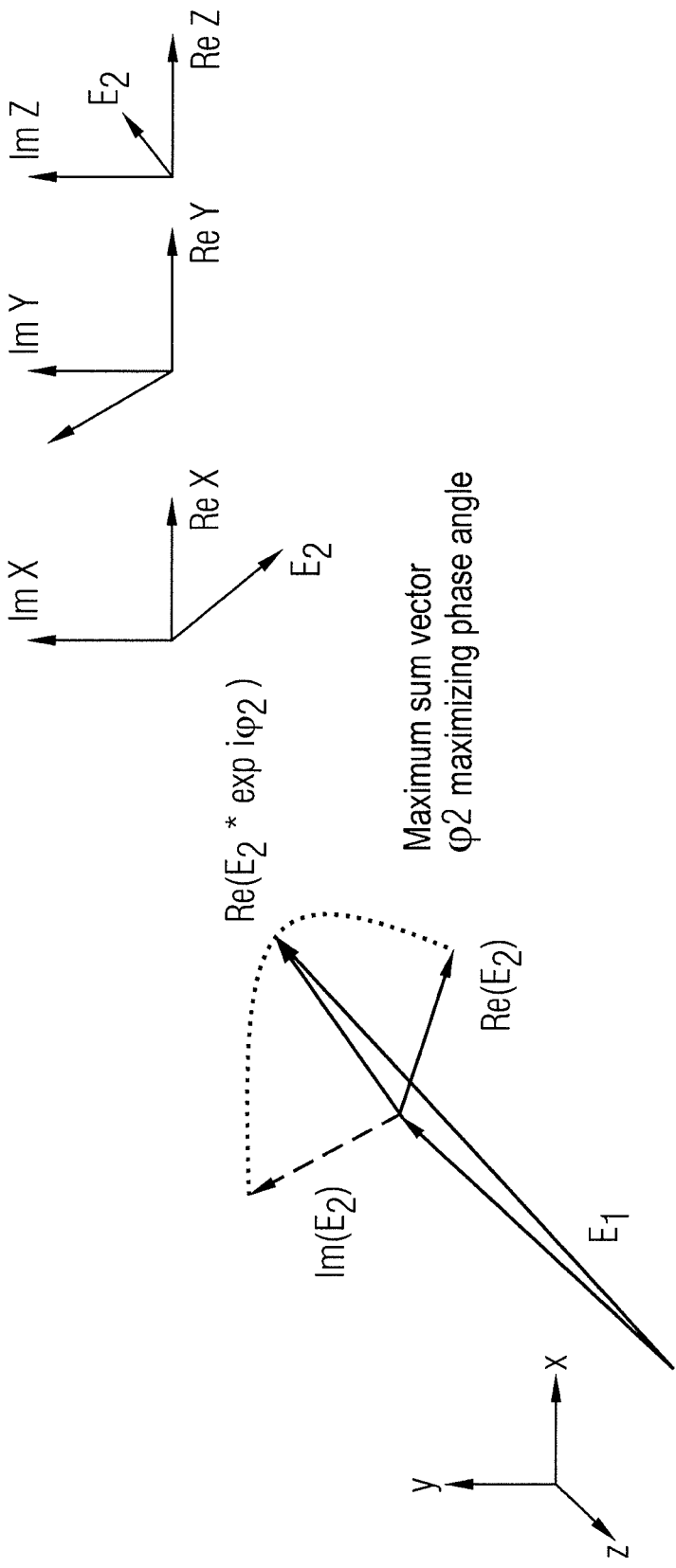
FIG. 4 illustrates the overlaying of the E-vectors of two antennas.

FIG. 4 shows (Part 1-Step 2) a complex case; here a real field (per definition) $E_1$ of a first coil is shown, the phase $\phi_2$ (relative to the first field $E_1$) of the field $E_2$ of an additional coil is selected so that the real part of $E_2$ maximally overlays three-dimensionally with the real part of $E_1$. (In general an exact parallelism of $E_1$ and $E_2$ cannot be achieved in 3D space.)

Figure 5:
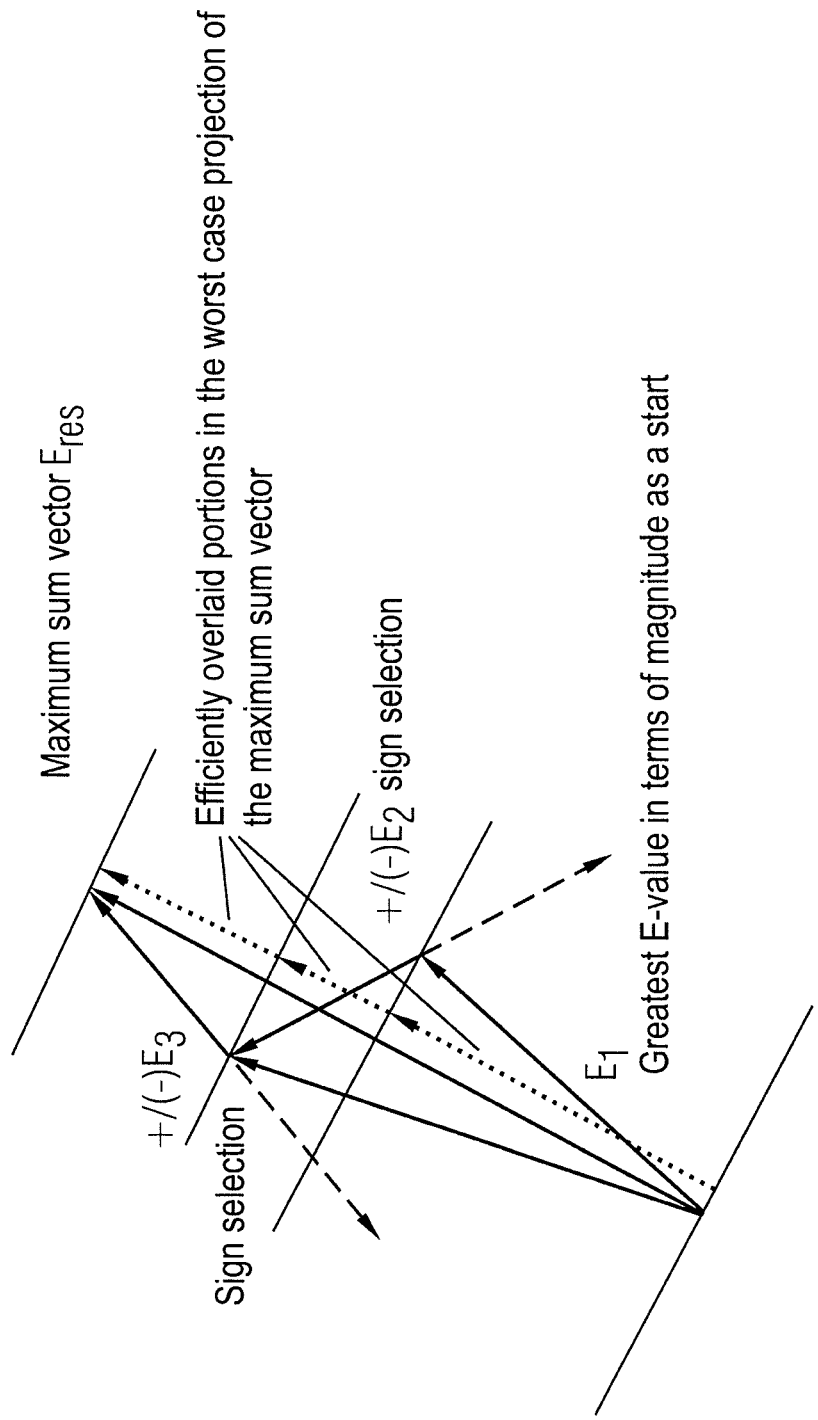
FIG. 5 illustrates the overlaying of the E-vectors of more than two antennas.

FIG. 5 shows (Part 2-Step 1) more than two (thus three here) E-field vectors. These are successively combined: it begins here with the largest E-vector; the E-vector that maximally superimposed with this is added (here only the real portion is shown). For efficiently superimposing portions, in the worst case a projection of the maximum sum vector is implemented.

Figure 6:
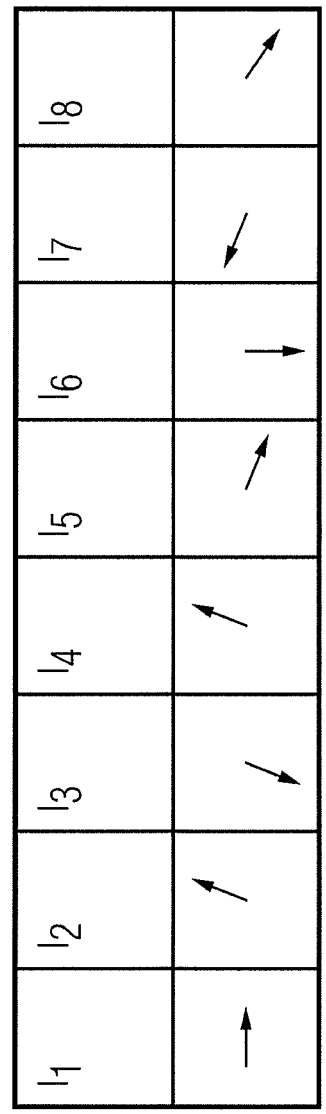
FIG. 6 shows the search for the phase for which a maximum total variable results.
Figure 7:
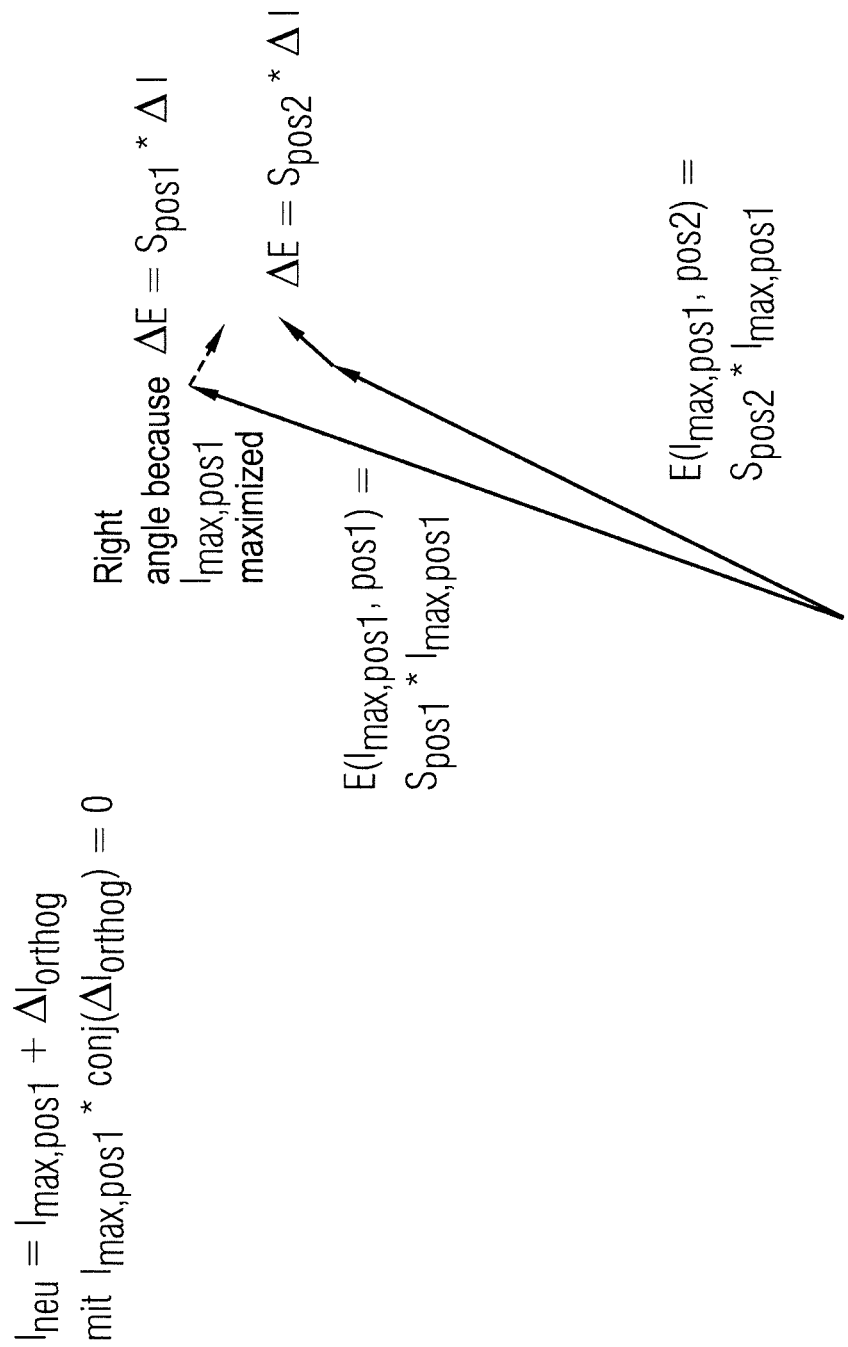
FIG. 7 shows model points at which the maximizing phase vector deviates only minimally from that of the first model point.
Figure 8:
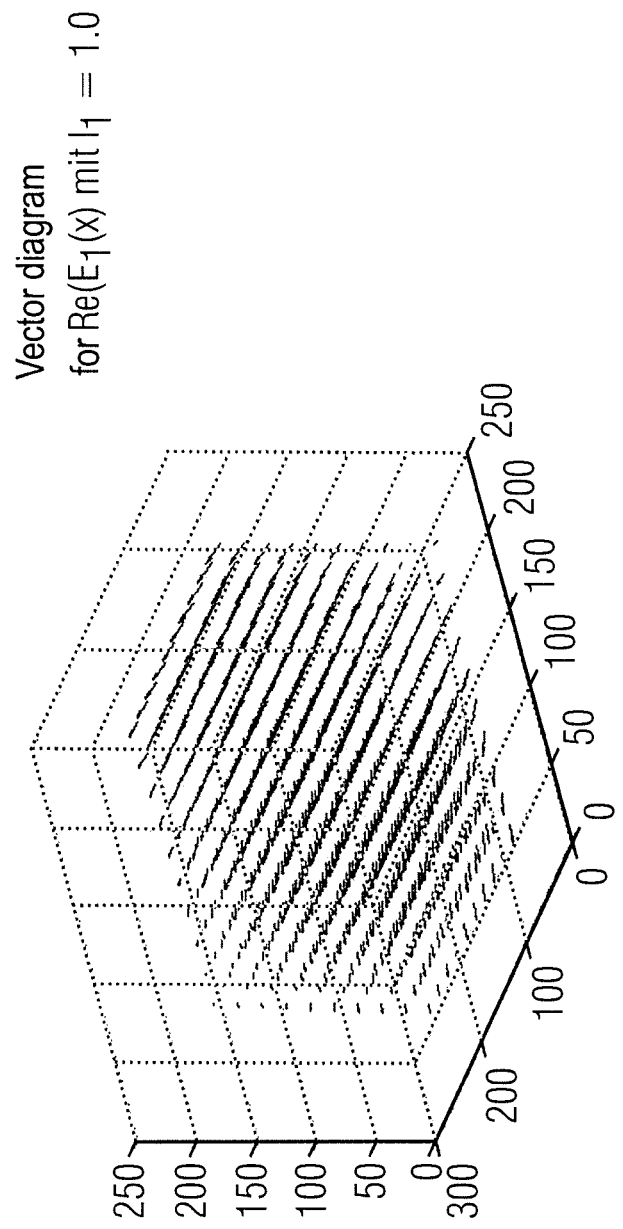
FIG. 8 shows prior tests with hypothetical data.
Figure 9:
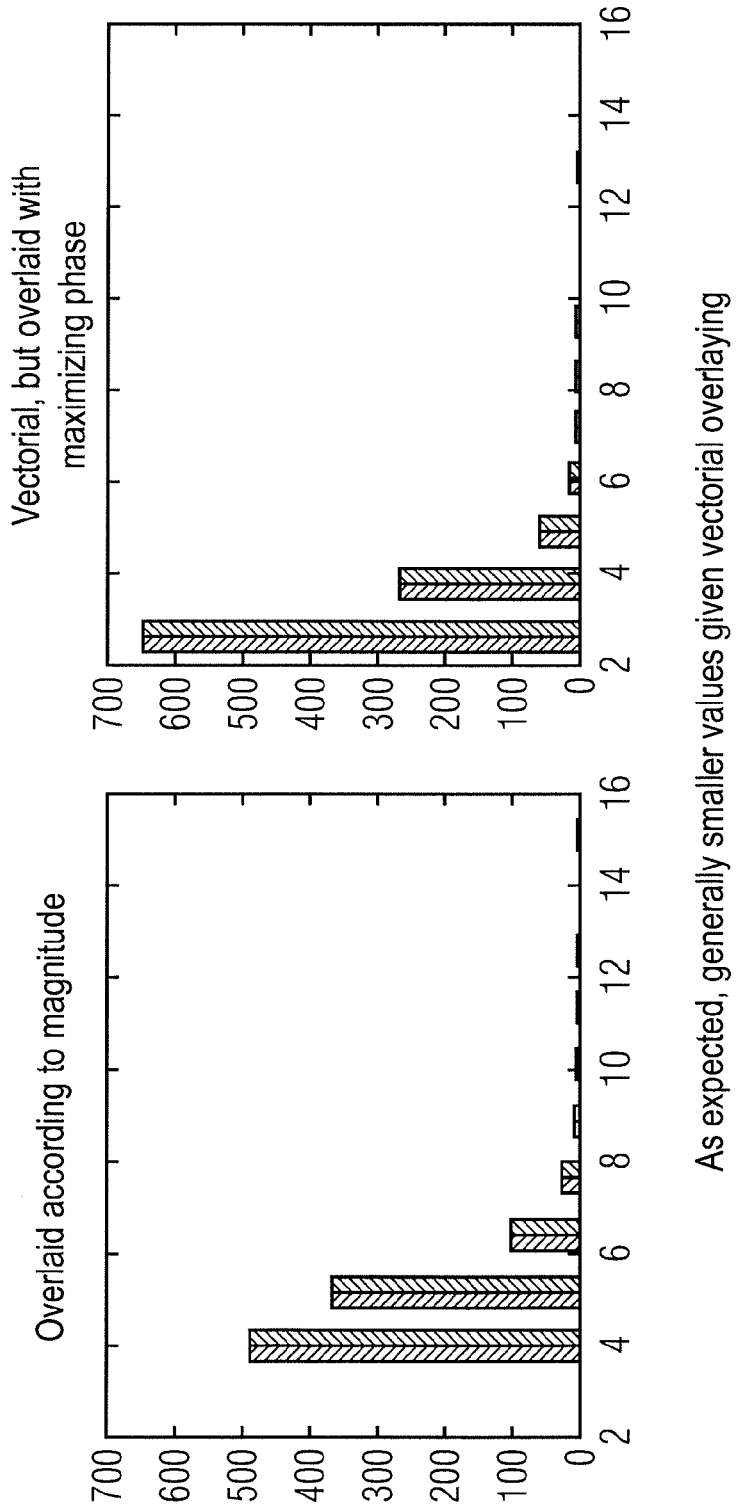
FIG. 9 shows histograms of the different overlay types in comparison.
Figure 10:
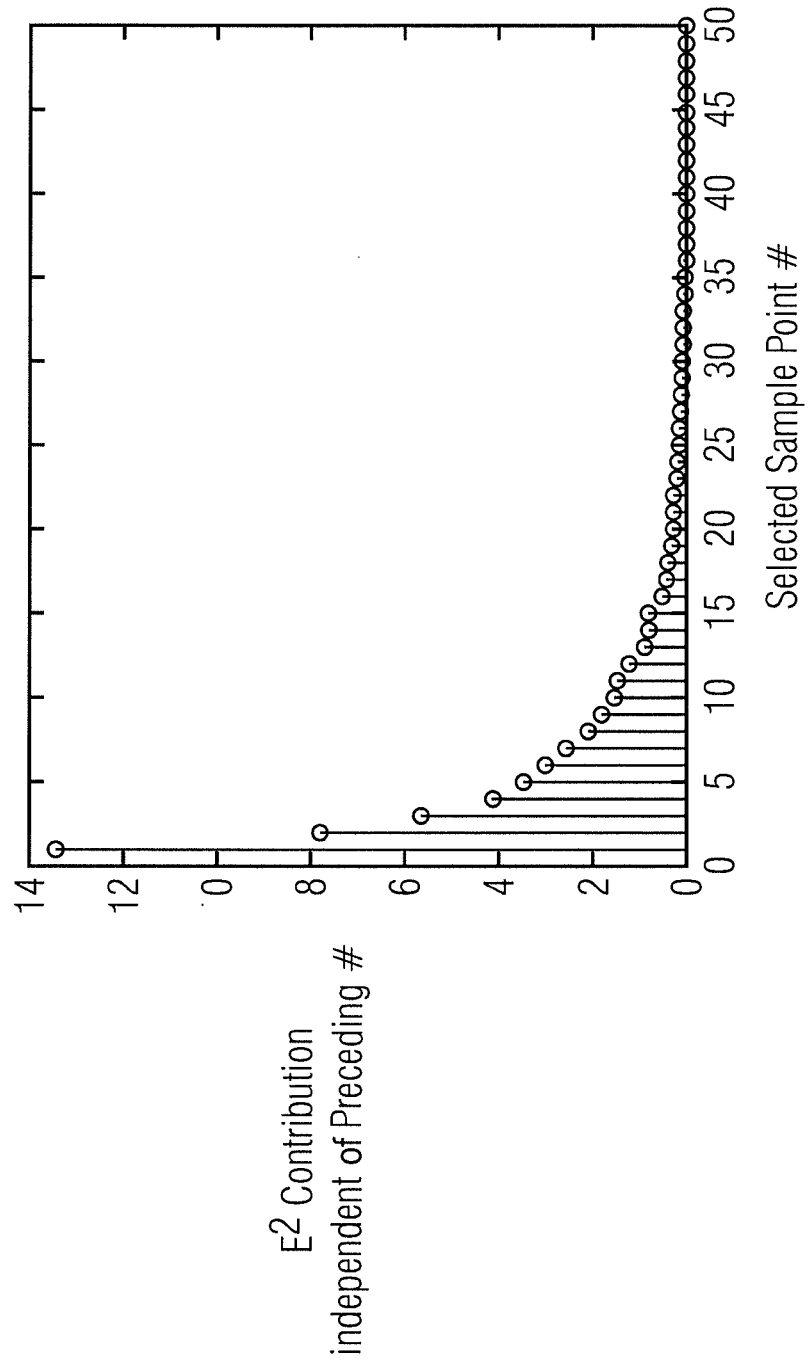
FIG. 10 shows the decrease of a weighted E-field "$E^2$-weighted" ("Sine-Square") over the number of concurrently considered phase vectors (or, respectively, model points connected with these), obtained within the scope of a test of the method on hypothetical data.
Figure 11:
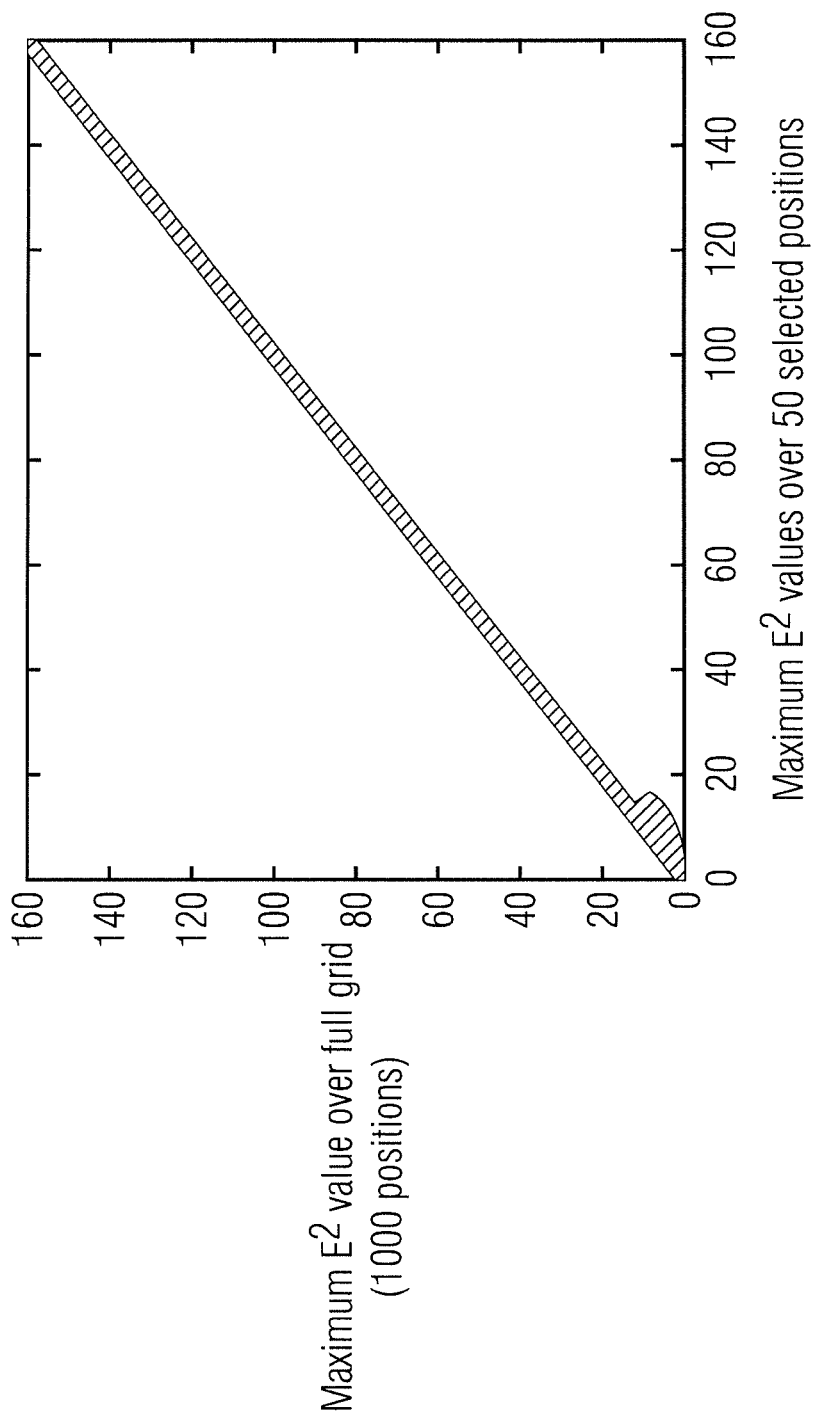
FIG. 11 shows, as a test, the coverage of the $E^2$ maxima at the 1,000 model points by the 50 selected virtual test points (10,000 random phase and amplitude combinations of the antenna currents).

FIG. 6 shows (Part 2-Step 2) more than two (here eight) vectors of E-fields that are respectively generated via a current ($I_1$ through $I_8$) in a respective coil of a coil array. Here the phase (model point transmission phases) of a current at which a maximum results in the combination of the E-fields is respectively sought in the complex region.

Here an 8-dimensional, complex vector (thus a vector with magnitude and phase of the E-field) results for the currents ($I_1$ through $I_8$) at which the E-fields (generated by the respective currents $I_1$ through $I_8$) would maximally superimpose, as well as the magnitude of the maximal E-field overlay ($I_1$=1+0i per definition).

An identification of "virtual measurement points" (respectively in particular at the primary model point voxel or one of the auxiliary model point voxels) follows for the local SAR monitoring (if a patient is examined), which "virtual measurement points" take into account the (most relevant) overlaying possibilities of the E-vectors.

For the monitoring a first "virtual measurement point" (at a primary model point voxel) is initially chosen so that the E-fields can theoretically maximally superimpose at its position (for example such that a maximum $Re(\sigma E^2)$ results).

This model point also covers all of the model points at which the maximizing current phase vector (the currents $I_1$ through $I_8$) is the same except for one factor.

Additional model points (in auxiliary model point voxels) with E-vectors deviating from these for additional difficult cases (worst cases) of one of the multiple (8 if there are 8 coils) complex E-vectors are not yet covered. The greater the deviation, the greater the risk.

Model points in which the maximizing phase vector deviates only slightly from that of the first model point will deliver lower SAR than the first model point if the $\sigma E^2$ maximum value of the first model point has a sufficient separation from that of the second model point:

$$I_{new}=I_{max,pos1}+\Delta I_{orthog} \text{ with } I_{max,pos1}*conj(\Delta I_{orthog})=0$$

$$\Delta E = S_{pos1} * \Delta I$$

$$\Delta E = S_{pos2} * \Delta I$$

$$E(I_{max,pos1, pos2}) = S_{pos2} * I_{max, pos1}$$

$$E(I_{max,pos1, pos1}) = S_{pos1} * I_{max, pos1}$$

Additional model points are thus sought that optimally expand, i.e.

that likewise have a high potential maximum SAR value whose SAR-maximizing current phase distribution deviates maximally from that of the already found model point.

Heuristic approach:

„Sine-Square"=1−„Cos-Square=1−Abs($I_1$*con($I_2$))² is used as a measure of the difference of the 8th phase vectors $I_1$ and $I_2$.

The potential SAR values of all points are multiplied with the difference measurement of the phase vectors relative to the first point.

A model point with newly weighted maximum value is sought.

The potential SAR values of all points are multiplied with the difference measurement of the phase vectors relative to the second point.

. . . (continued iteration)

Auxiliary model point voxels are thus identified at which the phases (auxiliary model point transmission phases) of the currents in the coils are markedly different than in a primary model point voxel (for example displaced by 180° relative to the phase in a primary model point voxel).

This can ensue for multiple models of different weight, different size, etc.

When a patient is examined, the model that best corresponds to the patient (examination subject) can be identified with a (if necessary brief) scan, and the currents in the coils are limited so that the model points identified for the selected model (examination subject) do not exhibit any electrical fields greater than predetermined electrical fields.

FIGS. 8-12 show results of tests.

Although modifications and changes may be suggested by those skilled in the art, it is the intention of the inventor to embody within the patent warranted hereon all changes and modifications as reasonably and properly come within the scope of his contribution to the art.

We claim as my invention:

1. A method for specific absorption rate (SAR) monitoring in a magnetic resonance (MR) system comprising a plurality of transmit coils that are individually activated by being charged with respective currents to cause each coil to emit an electrical field having a field variable pertaining thereto, each current having a magnitude and a phase, said method comprising the steps of:

in a computerized processor, modeling a modeled examination subject as a plurality of voxels, each respective voxel having a total electrical field therein produced by vectorial addition of the respective contributions to the respective voxel by the respective electrical fields emitted by said plurality of transmit coils, said total electrical field exhibiting a total field variable;

in said processor, automatically identifying a primary model point voxel, among said plurality of voxels, in which an absolute maximum of said total field variable exists within said modeled examination subject;

in said processor, automatically identifying at least one auxiliary model point voxel, among said plurality of voxels, in which a relative maximum of said total field variable exists within said modeled examination subject;

in said processor, determining respective relative times of activation of the respective coils in said plurality of transmit coils to produce said absolute maximum of said total field variable in said primary model point voxel;

in said processor, automatically back-calculating, from said total field variable of said at least one auxiliary model point voxel, respective relative times of activation of the respective coils in said plurality of transmit coils to produce said relative maximum of said total field variable in said at least one auxiliary model point voxel;

electronically storing said primary model point voxel and said at least one auxiliary model point voxel; and subsequently acquiring magnetic resonance data from an actual examination subject in said magnetic resonance system and, before or during acquisition of said magnetic resonance data, retrieving the stored primary model point voxel and the stored at least one auxiliary model point voxel and monitoring SAR of the actual examination subject in the respective voxels of the actual examination subject corresponding to the primary model point voxel and the at least one auxiliary model point voxel.

2. A method as claimed in claim 1 comprising identifying said primary model point voxel and said at least one auxiliary model point voxel for each of a plurality of different modeled examination subjects, each having a body weight and a body shape, and electronically storing each of the primary model point voxel and the at least one auxiliary model point voxel identified for said different modeled examination subjects, and identifying a body weight and a body shape of said actual examination subject and retrieving, and using for SAR monitoring of said actual examination subject, the stored primary model point voxel and the stored at least one auxiliary model point voxel for the modeled examination subject having a body weight and a body shape most closely corresponding to the body weight and the body shape of the actual examination subject.

3. A method as claimed in claim 1 comprising determining the respective phases of the respective currents that produce said relative maximum at said at least one auxiliary model point voxel as being temporally shifted relative to the respective phases of the respective currents that produce said absolute maximum at said primary model point voxel.

4. A method as claimed in claim 1 comprising determining only the respective phases of the respective currents that produce said relative maximum at said at least one auxiliary model point voxel that deviate from the respective phases of the respective currents that produce the absolute maximum at the primary model point voxel, without determining different magnitudes of respective transmission powers in the respective transmit coils.

5. A method as claimed in claim 1 comprising, when said SAR monitoring of the actual examination subject indicates that the SAR exceeds a predetermined value, automatically interrupting supply of current to at least one of said coils in said plurality of transmit coils.

6. A method as claimed in claim 1 comprising back-calculating said total field variable for said primary model point voxel, and determining said total field variable for said at least one auxiliary model point voxel, for multiple phases of at least some of said coils in said plurality of transmit coils.

7. A method as claimed in claim 1 comprising arranging said plurality of transmit coils as part of a whole-body coil of said MR system.

8. A method as claimed in claim 1 comprising employing eight coils as said plurality of transmit coils.

9. A method as claimed in claim 1 wherein each transmission coil comprises a plurality of rods.

10. A method as claimed in claim 1 comprising modeling said modeled examination subject with each of said voxels comprising a volume region of the examination subject of more than ten grams.

11. A method as claimed in claim 1 comprising employing, as said field variable, a variable selected from a group consisting of the electrical field itself, the electrical field itself multiplied by predetermined factor, the square of the electrical field, the square of the electrical field multiplied by a factor; and a sum of the squares of respective spatial field components of the electrical field, respectively multiplied by different factors.

12. A method as claimed in claim 1 comprising determining said field variable in said primary model point voxel and said at least one auxiliary model point voxel of said actual examination subject by activating a single coil in said plurality of transmit coils.

13. A method as claimed in claim 1 comprising determining and storing more than five auxiliary model point voxels.

14. A method as claimed in claim 1 comprising determining and storing more than ten auxiliary model point voxels.

15. A method as claimed in claim 1 comprising generating said respective currents in said coils in said plurality of transmit coils by applying respectively independent voltages, each having a magnitude and a phase, to the respective coils in said plurality of transmit coils.

16. A device for specific absorption rate (SAR) monitoring in a magnetic resonance (MR) system comprising a plurality of transmit coils that are individually activated by being charged with respective currents to cause each coil to emit an electrical field having a field variable pertaining thereto, each current having a magnitude and a phase, said device comprising:

a computerized processor supplied with a, model of a modeled examination subject comprising a plurality of voxels, each respective voxel having a total electrical field therein produced by vectorial addition of the respective contributions to the respective voxel by the respective electrical fields emitted by said plurality of transmit coils, said total electrical field exhibiting a total field variable;

said processor being configured to, automatically identify a primary model point voxel, among said plurality of voxels, in which an absolute maximum of said total field variable exists within said modeled examination subject;

said processor being configured to, automatically identify at least one auxiliary model point voxel, among said plurality of voxels, in which a relative maximum of said total field variable exists within said modeled examination subject;

said processor being configured to determine respective relative times of activation of the respective coils in said plurality of transmit coils to produce said absolute maximum of said total field variable in said primary model point voxel;

said processor being configured to, automatically back-calculate, from said total field variable of said at least one auxiliary model point voxel, respective relative times of activation of the respective coils in said plurality of transmit coils to produce said relative maximum of said total field variable in said at least one auxiliary model point voxel;

a memory in communication with said processor in which said processor electronically store said primary model point voxel and said at least one auxiliary model point voxel; and when subsequently acquiring magnetic resonance data from an actual examination subject in said magnetic resonance system said processor being configured to retrieve before or during acquisition of said magnetic resonance data, the stored primary model point voxel and the stored at least one auxiliary model point voxel and to monitor SAR of the actual examination subject in the respective voxels of the actual examination subject corresponding to the primary model point voxel and the at least one auxiliary model point voxel.

17. A device as claimed in claim 16 wherein said processor is configured to identify said primary model point voxel and said at least one auxiliary model point voxel for each of a plurality of different modeled examination subjects, each having a body weight and a body shape, and to electronically store each of the primary model point voxel and the at least one auxiliary model point voxel identified for said different modeled examination subjects, and to identify a body weight and a body shape of said actual examination subject and to retrieve, and use for SAR monitoring of said actual examination subject, the stored primary model point voxel and the stored at least one auxiliary model point voxel for the modeled examination subject having a body weight and a body shape most closely corresponding to the body weight and the body shape of the actual examination subject.

18. A device as claimed in claim 16 wherein said processor is configured to determine the respective phases of the respective currents that produce said relative maximum at said at least one auxiliary model point voxel as being temporally shifted relative to the respective phases of the respective currents that produce said absolute maximum at said primary model point voxel.

19. A device as claimed in claim 16 wherein said processor is configured to determine only the respective phases of the respective currents that produce said relative maximum at said at least one auxiliary model point voxel that deviate from the respective phases of the respective currents that produce the absolute maximum at the primary model point voxel, without determining different magnitudes of respective transmission powers in the respective transmit coils.

20. A device as claimed in claim 16 wherein said processor is configured to, when said SAR monitoring of the actual examination subject indicates that the SAR exceeds a predetermined value, automatically interrupt supply of current to at least one of said coils in said plurality of transmit coils.

21. A device as claimed in claim 16 wherein said processor is configured to back-calculate said total field variable for said primary model point voxel, and determine said total field variable for said at least one auxiliary model point voxel, for multiple phases of at least some of said coils in said plurality of transmit coils.

22. A device as claimed in claim 16 wherein said plurality of transmit coils are part of a whole-body coil of said MR system.

23. A device as claimed in claim 16 comprising eight coils in said plurality of transmit coils.

24. A device as claimed in claim 16 wherein each transmission coil comprises a plurality of rods.

25. A device as claimed in claim 16 wherein said processor is supplied with said model in a form that models said modeled examination subject with each of said voxels comprising a volume region of the examination subject of more than ten grams.

26. A device as claimed in claim 16 wherein said processor is configured to employ, as said field variable, a variable selected from a group consisting of the electrical field itself, the electrical field itself multiplied by predetermined factor, the square of the electrical field, the square of the electrical field multiplied by a factor; and a sum of the squares of respective spatial field components of the electrical field, respectively multiplied by different factors.

27. A device as claimed in claim 16 wherein said processor is configured to determine said field variable in said primary model point voxel and said at least one auxiliary model point voxel of said actual examination subject by activating a single coil in said plurality of transmit coils.

28. A device as claimed in claim 16 wherein said processor is configured to determine and store more than five auxiliary model point voxels.

29. A device as claimed in claim 16 wherein said processor is configured to determine and store more than ten auxiliary model point voxels.

30. A device as claimed in claim 16 comprising a current generator operated by said processor to generate said respective currents in said coils in said plurality of transmit coils by applying respectively independent voltages, each having a magnitude and a phase, to the respective coils in said plurality of transmit coils.

31. A method as claimed in claim 1 comprising determining the respective relative times of activation of the respective coils in said plurality of transmit coils by a back calculation from said total field variable of said primary model point voxel.

32. A device as claimed 16 wherein said processor is configured to determine the respective relative times of activation of the respective coils in said plurality of transmit coils by implementing a back-calculation from said total field variable of said primary model point voxel.

* * * * *